US012755785B2

(12) United States Patent
Zhao et al.

(10) Patent No.: US 12,755,785 B2
(45) Date of Patent: Oct. 6, 2026

(54) STORAGE DEVICE AND METHOD OF CONTROLLING STORAGE DEVICE

(71) Applicant: Kioxia Corporation, Tokyo (JP)

(72) Inventors: Dandan Zhao, Yokohama Kanagawa (JP); Hidenori Miyagawa, Yokohama Kanagawa (JP); Masakazu Goto, Moriya Ibaraki (JP)

(73) Assignee: Kioxia Corporation, Tokyo (JP)

( * ) Notice: Subject to any disclaimer, the term of this patent is extended or adjusted under 35 U.S.C. 154(b) by 63 days.

(21) Appl. No.: 18/830,510

(22) Filed: Sep. 10, 2024

(65) Prior Publication Data

US 2025/0095733 A1 Mar. 20, 2025

(30) Foreign Application Priority Data

Sep. 20, 2023 (JP) ................................ 2023-154017

(51) Int. Cl.
*G11C 13/00* (2006.01)
*G11C 5/06* (2006.01)

(52) U.S. Cl.
CPC ............ *G11C 13/0069* (2013.01); *G11C 5/06* (2013.01); *G11C 13/004* (2013.01)

(58) Field of Classification Search
CPC ..... G11C 13/0069; G11C 5/06; G11C 13/004; G11C 13/0007; G11C 13/003
USPC ............................................ 365/158, 189.01
See application file for complete search history.

(56) References Cited

U.S. PATENT DOCUMENTS

| | | | | |
|---|---|---|---|---|
| 9,373,410 | B1 * | 6/2016 | Kumar | G11C 13/0011 |
| 9,727,258 | B1 * | 8/2017 | Nazarian | G11C 16/0483 |
| 10,199,093 | B1 * | 2/2019 | Nguyen | G11C 11/419 |
| 2009/0190408 | A1 * | 7/2009 | Kux | G11C 13/0011 365/185.24 |

(Continued)

FOREIGN PATENT DOCUMENTS

| | | | | |
|---|---|---|---|---|
| FR | 3036221 | A1 * | 11/2016 | H10W 20/089 |
| JP | 2024-089605 | A | 7/2024 | |
| WO | WO-2022021307 | A1 * | 2/2022 | H10B 69/00 |

OTHER PUBLICATIONS

S. Hong et al., "Extremely high performance, high density 20nm self-selecting cross-point memory for Compute Express Link", 2022 International Electron Devices Meeting (IEDM), 2022, pp. 18.6.1-18.6.4 DOI: 10.1109/IEDM45625.2022.10019415.

(Continued)

*Primary Examiner* — Michael T Tran
(74) *Attorney, Agent, or Firm* — Kim & Stewart LLP

(57) ABSTRACT

A storage device includes a memory cell including first and second layers and a memory layer between the layers and switchable between states including a first state and a second state in which electrical resistance is higher than in the first state, and a circuit executing a write process. The circuit is configured to, in the process to switch the memory layer from the second to the first state, alternately apply to the second layer a first voltage having positive polarity and a second voltage having negative polarity, an absolute value of the second voltage being larger than the first voltage, and in the process to switch the memory layer from the first to the second state, alternately apply to the second layer a third voltage having negative polarity and a fourth voltage having positive polarity, an absolute value of the fourth voltage being larger than the third voltage.

18 Claims, 10 Drawing Sheets

(56) References Cited

U.S. PATENT DOCUMENTS

| | | | | |
|---|---|---|---|---|
| 2012/0081957 | A1 | 4/2012 | Kim et al. | |
| 2012/0201069 | A1* | 8/2012 | Honda | G11C 13/0069 365/148 |
| 2014/0078811 | A1* | 3/2014 | Kawai | G11C 13/0064 365/148 |
| 2014/0268997 | A1* | 9/2014 | Nazarian | G11C 13/0002 365/148 |
| 2015/0117128 | A1* | 4/2015 | Caubet | G02F 1/1524 438/57 |
| 2019/0206489 | A1* | 7/2019 | Wang | G11C 13/0004 |
| 2021/0366541 | A1 | 11/2021 | Boniardi et al. | |
| 2022/0068384 | A1* | 3/2022 | Han | G11C 13/0038 |
| 2022/0254413 | A1* | 8/2022 | Han | G11C 11/56 |
| 2022/0392526 | A1* | 12/2022 | Yang | G11C 13/003 |
| 2023/0051899 | A1 | 2/2023 | Hu et al. | |
| 2023/0083548 | A1* | 3/2023 | Wei | G11C 11/2275 365/145 |
| 2024/0215459 | A1 | 6/2024 | Iwasaki et al. | |

OTHER PUBLICATIONS

T. Ravsher et al., "Polarity-dependent threshold voltage shift in ovonic threshold switches: Challenges and opportunities", 2021 IEEE International Electron Devices Meeting (IEDM), 2021, pp. 28.4.1-28.4.4 DOI: 10.1109/IEDM19574.2021.9720649.

* cited by examiner

STORAGE DEVICE AND METHOD OF CONTROLLING STORAGE DEVICE

CROSS-REFERENCE TO RELATED APPLICATIONS

This application is based upon and claims the benefit of priority from Japanese Patent Application No. 2023-154017, filed Sep. 20, 2023, the entire contents of which are incorporated herein by reference.

FIELD

Embodiments described herein relate generally to a storage device and a method of controlling the storage device.

BACKGROUND

As large-capacity nonvolatile storage devices, there is a crosspoint type two-terminal storage device. A crosspoint type two-terminal storage device facilitates miniaturization and high integration of memory cells.

Among the memory cells of a crosspoint type two-terminal storage device, there are memory cells that have both a variable resistance function and a switching function, for example. As a result of the memory cells having a switching function, the current that flows through the memory cells other than the selected memory cell is suppressed.

DETAILED DESCRIPTION

Figure 1:
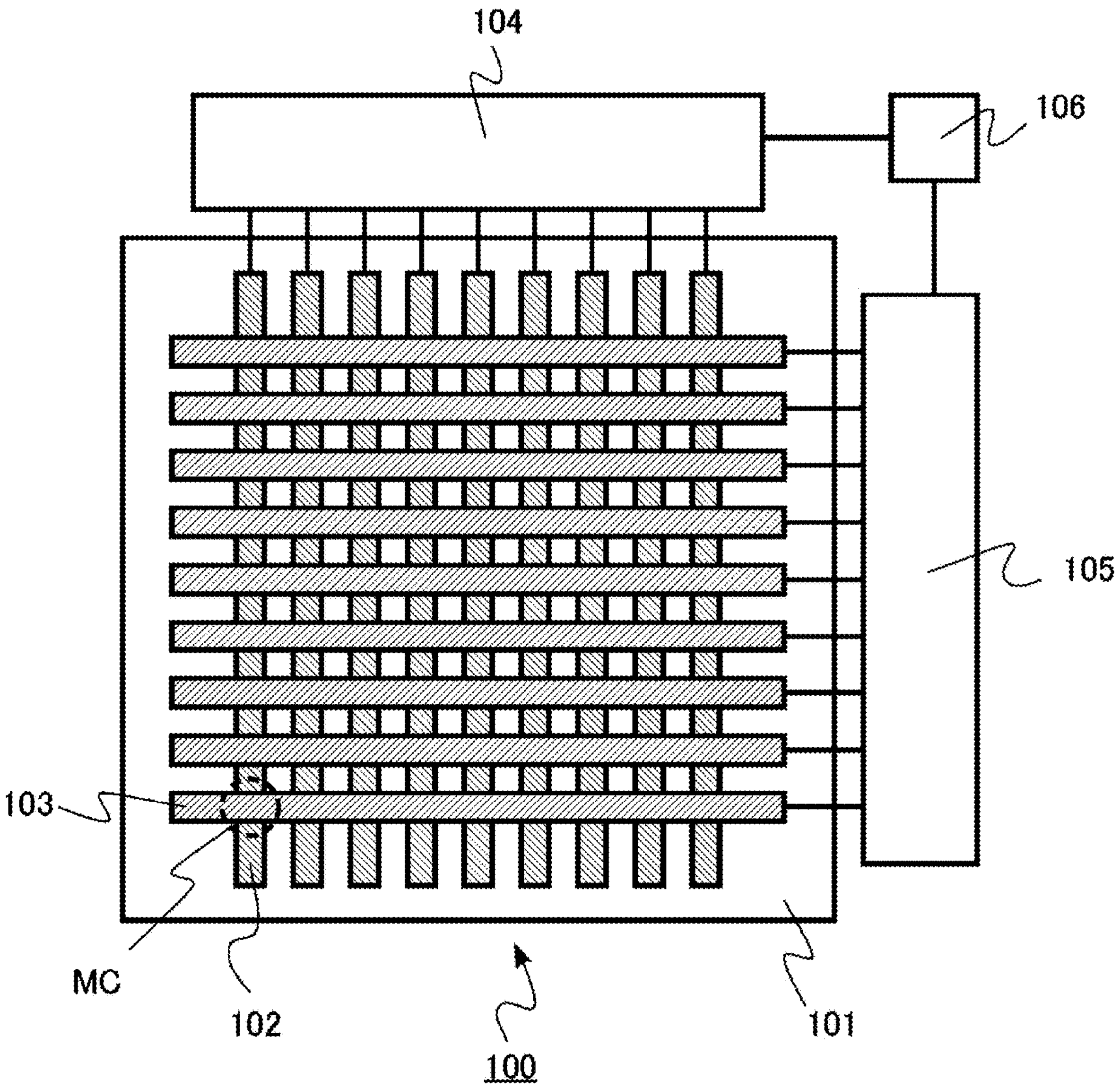
FIG. 1 is a block diagram of a storage device of a first embodiment.

Embodiments of the present disclosure provide a storage device excellent in characteristics.

In general, according to one embodiment, a storage device comprises a memory cell including a first conductive layer, a second conductive layer, and a memory layer that is between the first and second conductive layers and can switch between a plurality of states, the states including a first state and a second state in which electrical resistance of the memory layer is higher than the first state; and a control circuit capable of executing a write process by which the states of the memory cell are switched. The control circuit is configured to: in the write process to switch the memory layer from the second state to the first state, alternately apply to the second conductive layer a first voltage having positive polarity and a second voltage having negative polarity, an absolute value of the second voltage being larger than an absolute value of the first voltage, and the second voltage being applied to the second conductive layer at the end of the write process, and in the write process to switch the memory layer from the first state to the second state, alternately apply to the second conductive layer a third voltage having negative polarity and a fourth voltage having positive polarity, an absolute value of the fourth voltage being larger than an absolute value of the third voltage, and the fourth voltage being applied to the second conductive layer at the end of the write process.

Hereinafter, embodiments of the present disclosure will be described with reference to the drawings. Note that in the following explanation, same or similar elements are assigned same reference signs, and explanation of such elements may not be repeated.

It is possible to perform qualitative analysis and quantitative analysis of a chemical composition composing a storage device in the present specification by, for example, Rutherford Backscattering spectroscopy (RBS), Secondary Ion Mass Spectroscopy (SIMS), Energy Dispersive X-ray Spectroscopy (EDX), Electron Energy Loss Spectroscopy (EELS), and the like. Further, it is possible to use, for example, Transmission Electron Microscope (TEM) to measure thicknesses of the components of the storage device, distances between the components and the like. Furthermore, it is possible to use, for example, X-ray Photoelectron Spectroscopy (XPS), X-ray Absorption Fine Structure (XAFS) spectroscopy, Raman Spectroscopy (Raman), or EELS to identify the constituent substances of the components of the storage device, and measure the chemical composition, abundance ratio, bonding states, local structures (atomic distances, coordination numbers), and chemical states of the constituent substances.

First Embodiment

A storage device of a first embodiment includes a memory cell containing a first conductive layer, a second conductive layer, and a memory layer that is provided between the first conductive layer and the second conductive layer and can become a first state, and a second state having higher electrical resistance than the first state, and a control circuit capable of executing a write process to the memory cell, wherein in the write process, when the state of the memory layer is changed from the second state to the first state, a first voltage having positive polarity, and a second voltage having negative polarity and having an absolute value larger than an absolute value of the first voltage are alternately applied to the second conductive layer a plurality of times and the final voltage is the second voltage, and in the write process, when the state of the memory layer is changed from the first state to the second state, a third voltage having negative polarity, and a fourth voltage having positive polarity and having an absolute value larger than an absolute value of the third voltage are alternately applied to the second conductive layer a plurality of times and the final voltage is the fourth voltage.

Furthermore, a method of controlling a storage device of the first embodiment is a method of controlling a storage device including a memory cell containing a first conductive layer, a second conductive layer, and a memory layer that is provided between the first conductive layer and the second conductive layer and can become a first state, and a second state having higher electrical resistance than the first state, wherein a first voltage having positive polarity, and a second voltage having negative polarity and having an absolute value larger than an absolute value of the first voltage are alternately applied to the second conductive layer a plurality of times and the final voltage is the second voltage to change the state of the memory cell from the second state to the first state, and a third voltage having negative polarity, and a fourth voltage having positive polarity and having an absolute value larger than an absolute value of the third voltage are alternately applied to the second conductive layer a plurality of times and the final voltage is the fourth voltage to change the state of the memory cell from the first state to the second state.

FIG. 1 is a block diagram of a storage device according to a first embodiment.

The storage device of the first embodiment includes a memory cell array 100, a first control circuit 104, a second control circuit 105, and a sense circuit 106. The memory cell array 100 includes a semiconductor substrate 101, a plurality of word lines 102, and a plurality of bit lines 103.

The word lines 102 are provided above the semiconductor substrate 101, for example. Between the semiconductor substrate 101 and the word lines 102, for example, an insulating layer is provided. The bit lines 103 are provided above the word lines 102. The bit lines 103 may be provided below the word lines 102. The bit lines 103 intersect the word lines 102. The word lines 102 and the bit lines 103 extend in a direction parallel to a surface of the semiconductor substrate 101, for example.

In regions where the word lines 102 and the bit lines 103 intersect each other, a plurality of memory cells MC are provided. One single memory cell MC is provided in a region where the one single word line 102 and the one single bit line 103 intersect each other. The storage device of the first embodiment is a two-terminal memory including a crosspoint structure.

The first control circuit 104, the second control circuit 105, and the sense circuit 106 are provided around the memory cell array 100, for example.

The word lines 102 are connected to the first control circuit 104. Further, the bit lines 103 are connected to the second control circuit 105. The sense circuit 106 is connected to the first control circuit 104 and the second control circuit 105.

For example, the first control circuit 104 and the second control circuit 105 select a desired memory cell MC, and can execute a write process of data to the memory cell MC, and a read process of data to the memory cell MC. At a time of read of the data, the data of the memory cell MC is read as an amount of the current flowing between the corresponding word line 102 and the corresponding bit line 103, or a potential change of the bit line 103. For example, the sense circuit 106 includes a function of detecting the amount of the current flowing between the word line 102 and the bit line 103, and distinguishing between the data, e.g., “1” or “0”.

The first control circuit 104, the second control circuit 105, and the sense circuit 106 are, for example, electronic circuits using semiconductor devices formed on the semiconductor substrate 101.

Figure 2:
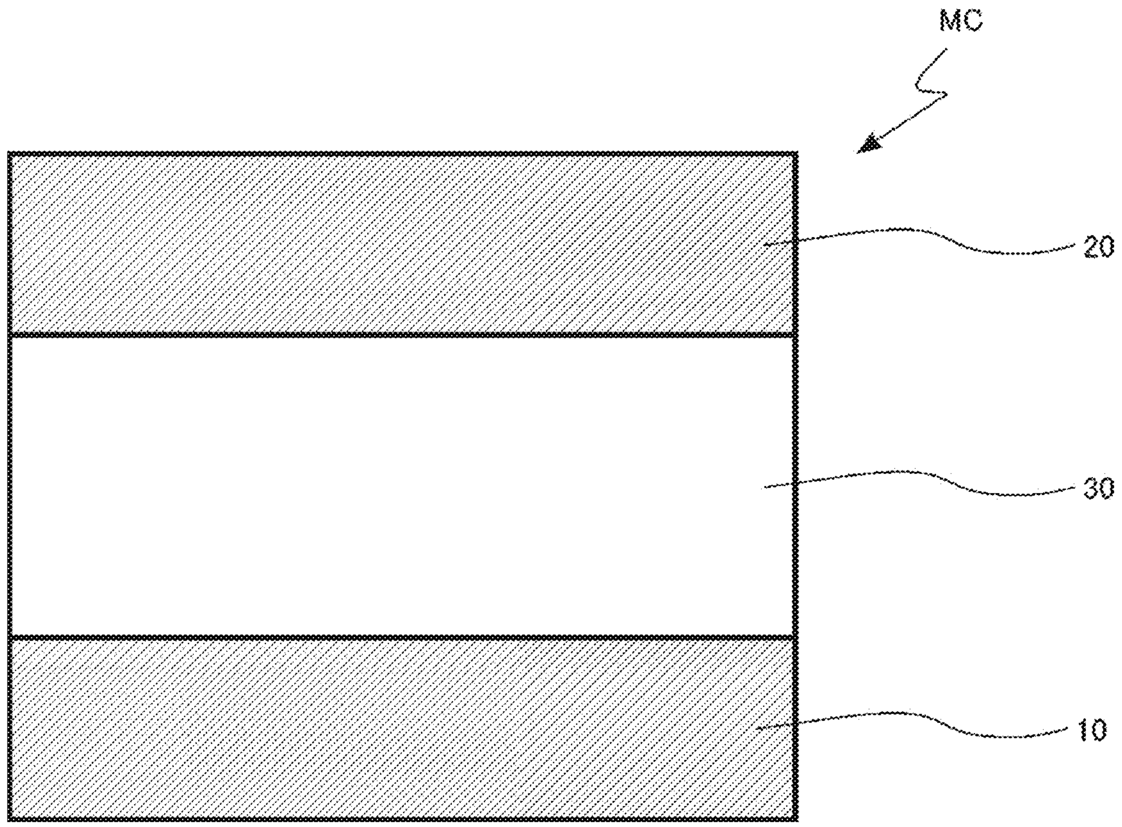
FIG. 2 is a schematic sectional view of a memory cell of the storage device of the first embodiment.

FIG. 2 is a schematic sectional view of the memory cell of the storage device of the first embodiment. FIG. 2 shows a section of the one single memory cell MC shown by a circle of a dotted line, for example, in the memory cell array 100 in FIG. 1.

As shown in FIG. 2, the memory cell MC incudes a lower electrode 10, an upper electrode 20, and a memory layer 30.

The lower electrode 10 is connected to the corresponding word line 102. The lower electrode 10 is, for example, a metal. The lower electrode 10 contains at least one substance selected from the group consisting of, for example, carbon, carbon nitride, tungsten, tungsten carbide, and tungsten nitride. The lower electrode 10 may be a part of the word line 102.

The upper electrode 20 is connected to the corresponding bit line 103. The upper electrode 20 is, for example, a metal. The upper electrode 20 contains at least one substance selected from the group consisting of, for example, carbon, carbon nitride, tungsten, tungsten carbide, and tungsten nitride. The upper electrode 20 may be a part of the bit line 103.

For example, the lower electrode 10 contains tungsten (W), and the upper electrode 20 contains carbon (C).

The memory layer 30 is provided between the lower electrode 10 and the upper electrode 20. A thickness of the memory layer 30 in a first direction from the lower electrode 10 toward the upper electrode 20 is, for example, more than or equal to 5 nm and less than or equal to 50 nm.

The memory layer 30 has a characteristic in which electric resistance varies by application of a predetermined voltage. The memory layer 30 has a variable resistance function for storing data. The memory layer 30 can become a low resistance state and a high resistance state having higher electrical resistance than the low resistance state. That is, the memory layer 30 has a variable resistance function.

The memory layer 30 has a function of suppressing the leakage current flowing through half-selected cells. The memory layer 30 has a nonlinear current-voltage characteristic in which a current rises sharply at a specific threshold voltage. The memory layer 30 has a switching function.

The memory layer 30 is, for example, a single layer. The memory layer 30 is, for example, a single layer and includes both the variable resistance function and the switching function.

The memory layer 30 contains, for example, an oxide or an oxynitride of a first element that is at least one element selected from the group consisting of zirconium (Zr), aluminum (Al), yttrium (Y), tantalum (Ta), lanthanum (La), cerium (Ce), titanium (Ti), hafnium (Hf), magnesium (Mg), scandium (Sc), vanadium (V), and niobium (Nb), and a compound of a second element that is at least one element selected from the group consisting of zinc (Zn), tin (Sn), gallium (Ga), indium (In), and bismuth (Bi), and a third element that is at least one element selected from the group consisting of tellurium (Te), sulfur(S), and selenium (Se).

The memory layer 30 contains, for example, at least one oxide selected from the group consisting of a zirconium oxide, aluminum oxide, yttrium oxide, tantalum oxide, lanthanum oxide, cerium oxide, titanium oxide, hafnium oxide, magnesium oxide, scandium oxide, vanadium oxide, and niobium oxide.

The memory layer 30 contains, for example, a chalcogenide of the second element. The memory layer 30 contains, for example, at least one chalcogenide selected from the group consisting of a zinc telluride, tin telluride, gallium telluride, indium telluride, bismuth telluride, zinc sulfide, tin sulfide, gallium sulfide, indium sulfide, bismuth sulfide, zinc selenide, tin selenide, gallium selenide, indium selenide, and bismuth selenide.

The memory layer 30 contains, for example, a zirconium oxide and zinc telluride.

The memory layer 30 contains, for example, an oxide or an oxynitride of a first element that is at least one element selected from the group consisting of zirconium (Zr), aluminum (Al), yttrium (Y), tantalum (Ta), lanthanum (La), cerium (Ce), titanium (Ti), hafnium (Hf), magnesium (Mg), scandium (Sc), vanadium (V), and niobium (Nb), antimony (Sb), and a second element that is at least one element selected from the group consisting of carbon (C), boron (B), nitrogen (N), silicon (Si), and tin (Sn). Note that the memory layer 30 may further contain zinc (Zn) in addition to the oxide or oxynitride of the above-described first element, antimony (Sb), and the above-described second element.

The memory layer 30 contains, for example, an oxide or an oxynitride of a first element that is at least one element selected from the group consisting of zirconium (Zr), yttrium (Y), tantalum (Ta), lanthanum (La), cerium (Ce), titanium (Ti), hafnium (Hf), magnesium (Mg), scandium (Sc), vanadium (V), and niobium (Nb), antimony (Sb), and a second element that is at least one element selected from the group consisting of carbon (C), boron (B), nitrogen (N), silicon (Si), and tin (Sn). Note that the memory layer 30 may further contain aluminum (Al) in addition to the oxide or oxynitride of the above-described first element, antimony (Sb), and the above-described second element.

Figure 3:
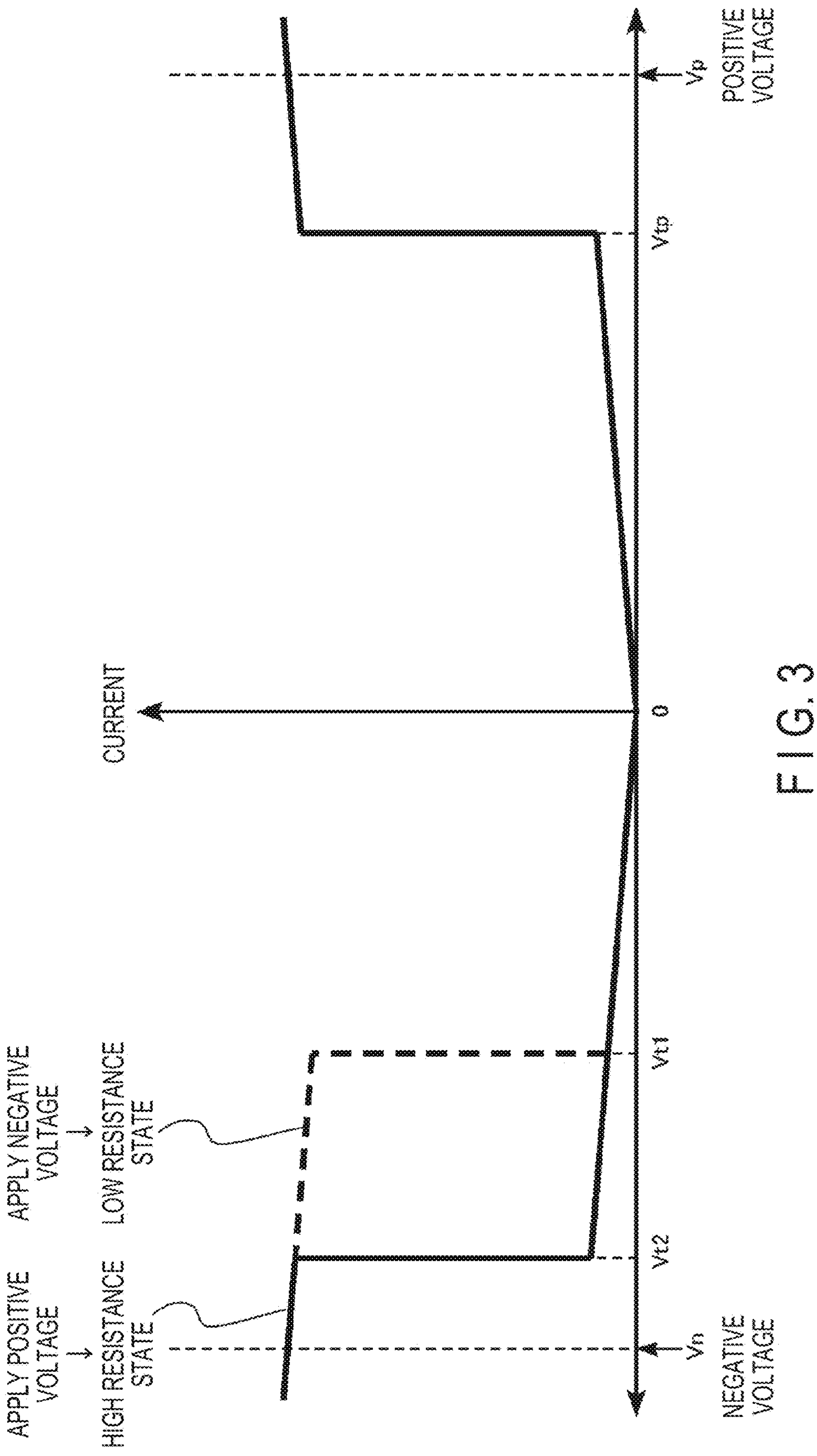
FIG. 3 is a diagram illustrating current-voltage characteristics of the storage device of the first embodiment.

FIG. 3 is a diagram illustrating current-voltage characteristics of the storage device of the first embodiment. The horizontal axis represents a voltage that is applied between the electrodes, and the vertical axis represents a current flowing between the electrodes. In FIG. 3, a voltage that is given to the upper electrode 20 based on the potential of the lower electrode 10 is shown in the horizontal axis. FIG. 3 is the current-voltage characteristics of the memory layer 30 or the memory cell MC of the first embodiment.

The memory cell MC of the first embodiment shows different current-voltage characteristics when a predetermined negative voltage (Vn in FIG. 3) is applied to the upper electrode 20, and when a predetermined positive voltage (Vp in FIG. 3) is applied to the upper electrode 20. In FIG. 3, a current-voltage characteristic in the case of the predetermined negative voltage Vn being applied to the upper electrode 20 is shown by a dotted line, and a current-voltage characteristic in the case of the predetermined positive voltage Vp being applied to the upper electrode 20 is shown by a solid line.

When the predetermined negative voltage Vn is applied to the upper electrode 20, a current sharply rises at a first threshold voltage Vt1 on a negative voltage side. When the predetermined negative voltage Vn is applied to the upper electrode 20, a current sharply rises at a positive voltage side threshold voltage Vtp on a positive voltage side.

On the other hand, when the predetermined positive voltage Vp is applied to the upper electrode 20, a current sharply rises at a second threshold voltage Vt2 on the negative voltage side. An absolute value of the second threshold voltage Vt2 is larger than an absolute value of the first threshold voltage Vt1. When the predetermined positive voltage Vp is applied to the upper electrode 20, a current sharply rises at the positive voltage side threshold voltage Vtp as in the case of the predetermined negative voltage Vn being applied, on the positive voltage side.

An absolute value of the predetermined negative voltage Vn is larger than the absolute value of the second threshold voltage Vt2.

The memory cell MC of the first embodiment can become a low resistance state and a high resistance state on the negative voltage side. The memory layer 30 of the first embodiment can become the low resistance state and the high resistance state on the negative voltage side.

The memory cell MC of the first embodiment is in a single resistance state on the positive voltage side. The memory layer 30 of the first embodiment is in the single resistance state on the positive voltage side.

The memory cell MC of the first embodiment has non-linear current-voltage characteristics in which a current rises at specific threshold voltages on the negative voltage side and the positive voltage side. Further, the memory cell MC of the first embodiment has a current-voltage characteristic in which the threshold voltage changes by application of a predetermined voltage, on the negative voltage side.

Hereinafter, the low resistance state represents the data of "1", and the high resistance state represents the data of "0". The memory cell MC can represent two values of "1" and "0", and thereby can store 1-bit data.

Figure 4:
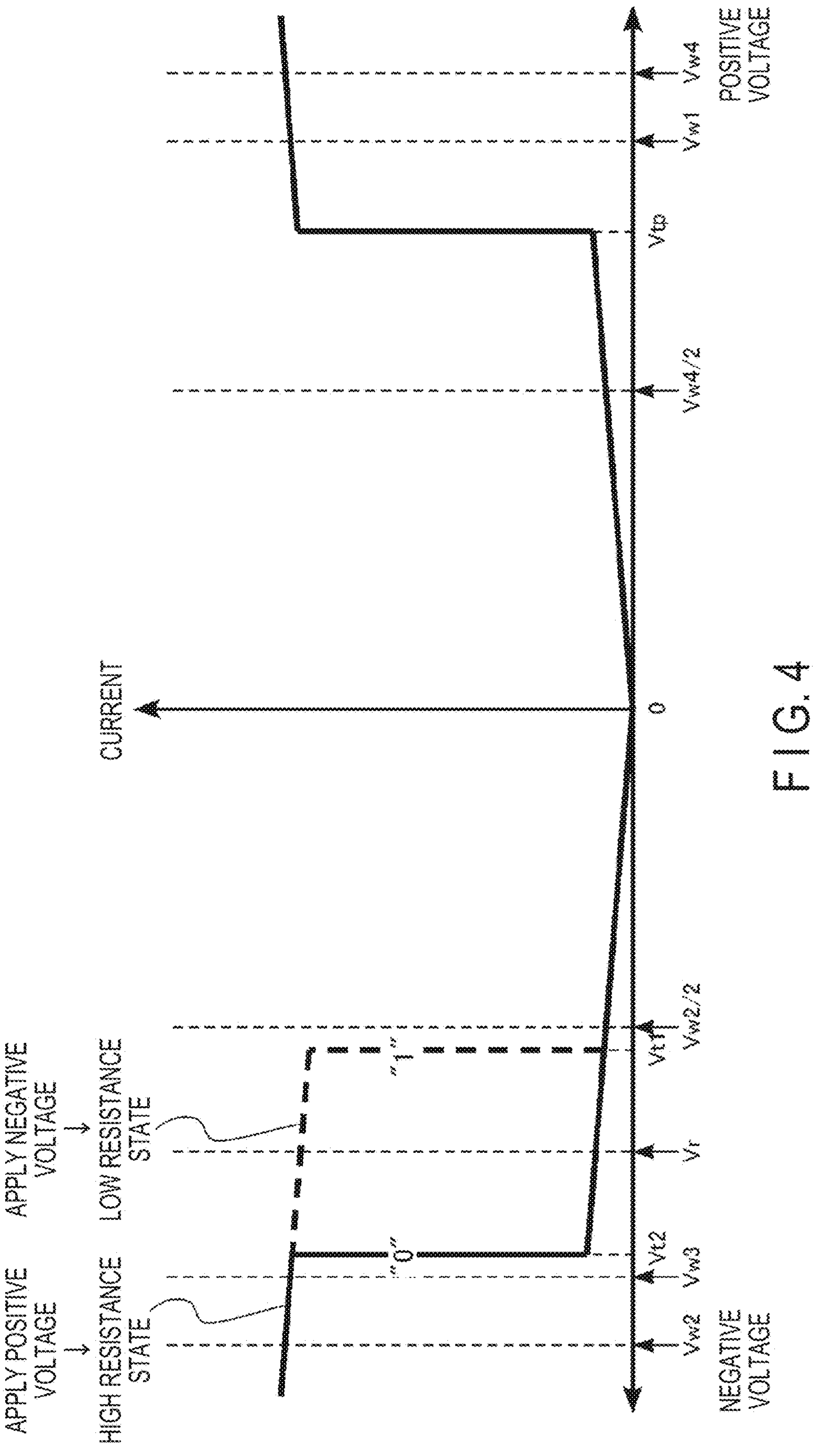
FIG. 4 is a diagram illustrating a memory operation of the storage device of the first embodiment.

FIG. 4 is a diagram illustrating a memory operation of the storage device of the first embodiment. FIG. 4 shows a first write voltage Vw1, a second write voltage Vw2, a third write voltage Vw3, a fourth write voltage Vw4, a voltage (Vw2/2) that is half the second write voltage Vw2, a voltage (Vw4/2) that is half the fourth write voltage Vw4, and a read voltage Vr.

The first write voltage Vw1 is a positive voltage. The second write voltage Vw2 is a negative voltage. An absolute value of the second write voltage Vw2 is larger than an absolute value of the first write voltage Vw1. The absolute value of the second write voltage Vw2 is larger than or equal to 1.1 times and less than or equal to 5 times the absolute value of the first write voltage Vw1, for example.

An absolute value of a current flowing through the memory layer 30 by application of the second write voltage Vw2 is larger than an absolute value of the current flowing through the memory layer 30 by application of the first write voltage Vw1. The absolute value of the current flowing through the memory layer 30 by application of the second write voltage Vw2 is larger than or equal to 1.1 times and less than or equal to 5 times the absolute value of the current flowing through the memory layer 30 by application of the first write voltage Vw1, for example.

The third write voltage Vw3 is a negative voltage. The fourth write voltage Vw4 is a positive voltage. An absolute value of the fourth write voltage Vw4 is larger than an absolute value of the third write voltage Vw3. The absolute value of the fourth write voltage Vw4 is larger than or equal to 1.1 times and less than or equal to 5 times the absolute value of the third write voltage Vw3, for example.

An absolute value of a current flowing through the memory layer 30 by application of the fourth write voltage Vw4 is larger than an absolute value of a current flowing through the memory layer 30 by application of the third write voltage Vw3. The absolute value of the current flowing through the memory layer 30 by application of the fourth write voltage Vw4 is larger than or equal to 1.1 times and less than or equal to 5 times the absolute value of the current flowing through the memory layer 30 by application of the third write voltage Vw3, for example.

The absolute value of the third write voltage Vw3 is larger than the absolute value of the second threshold voltage Vt2. The absolute value of the second write voltage Vw2 is larger than the absolute value of the third write voltage Vw3, for example.

The read voltage Vr is a negative voltage. An absolute value of the read voltage Vr is larger than the absolute value of the first threshold voltage Vt1, and smaller than the absolute value of the second threshold voltage Vt2. The absolute value of the read voltage Vr is smaller than the absolute value of the second write voltage Vw2.

First, a write process to the memory cell MC will be described. The write process is performed by using the first control circuit 104 and the second control circuit 105.

Figure 5:
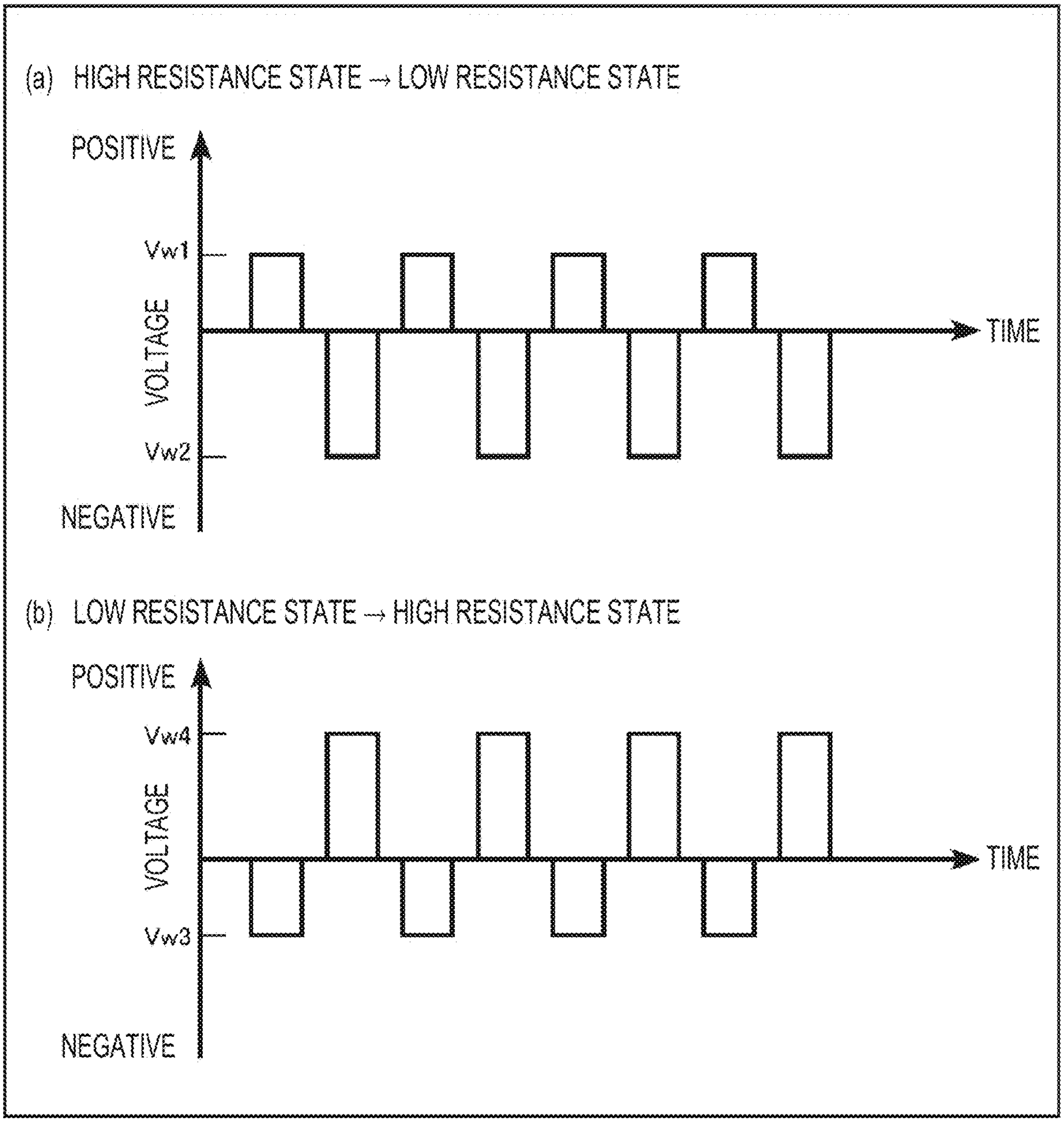
FIG. 5 is a diagram illustrating a write process of the storage device of the first embodiment.

FIG. 5 is a diagram illustrating the write process of the storage device of the first embodiment. Specifically, FIG. 5(*a*) and FIG. 5(*b*) show changes over time in voltage applied between the lower electrode 10 and the upper electrode 20 of the memory cell MC at a time of the write process. A voltage of the vertical axis shows a voltage applied to the upper electrode 20 based on a potential of the lower electrode 10.

The voltage applied between the lower electrode 10 and the upper electrode 20 of the memory cell MC is applied as a rectangular wave or a triangular wave, for example.

FIG. 5(*a*) shows a case in which the state of the memory layer 30 is changed from the high resistance state to the low resistance state. In other words, FIG. 5(*a*) shows a case in which data of the memory cell MC is changed from data "O" to data "1". In other words, FIG. 5(*a*) shows a case in which data "1" is written to the memory cell MC.

When the state of the memory layer 30 is changed from the high resistance state to the low resistance state, the first write voltage Vw1 having positive polarity, and the second write voltage Vw2 having negative polarity and having a larger absolute value than the first write voltage Vw1 are alternately applied to the upper electrode 20 a plurality of times and the final voltage is the second write voltage Vw2.

Although FIG. 5(*a*) illustrates the case in which the first write voltage Vw1 and the second write voltage Vw2 are alternately applied four times, the number of application of each of the first write voltage and the second write voltage is two or more. In other words, the number of repetitions of application is not particularly limited as long as it is once or more. Furthermore, although FIG. 5(*a*) illustrates the case in which the voltage that is applied first is the first write voltage Vw1, the voltage that is applied first may be the second write voltage Vw2.

FIG. 5(*b*) shows the case in which the state of the memory layer 30 is changed from the low resistance state to the high resistance state. In other words, FIG. 5(*b*) shows the case in which the data of the memory cell MC is changed from data "1" to data "0". In other words, FIG. 5(*b*) shows the case in which data "0" is written to the memory cell MC.

When the state of the memory layer 30 is changed from the low resistance state to the high resistance state, the third write voltage Vw3 having negative polarity, and the fourth write voltage Vw4 having positive polarity and having a larger absolute value than the third write voltage Vw3 are alternately applied to the upper electrode 20 a plurality of times and the final voltage is the fourth write voltage Vw4.

Although FIG. 5(*b*) illustrates the case in which the third write voltage Vw3 and the fourth write voltage Vw4 are alternately applied four times, the number of repetitions of application is not particularly limited as long as it is once or more. Furthermore, although FIG. 5(*b*) illustrates the case in which the voltage that is applied first is the third write voltage Vw3, the voltage that is applied first may be the fourth write voltage Vw4.

Next, a read process to the memory cell MC will be described. The read process is performed by using the first control circuit 104, the second control circuit 105, and the sense circuit 106.

In the read process, the read voltage Vr is applied to the upper electrode 20. The read voltage Vr is a negative voltage. In other words, the read voltage Vr is applied between the upper electrode 20 and the lower electrode 10 so that a potential of the upper electrode 20 is lower than a potential of the lower electrode 10. The read voltage Vr is applied to the upper electrode 20, and for example, a current flowing between the lower electrode 10 and the upper electrode 20 is detected by the sense circuit 106. Further, the read voltage Vr is applied to the upper electrode 20, and for example, change in potential of the upper electrode 20 or the lower electrode 10 is detected by the sense circuit 106. The change in the potential of the upper electrode 20 or the lower electrode 10 is detected as a change in potential of the bit line 103, for example.

For example, when a current that exceeds a predetermined threshold current flows between the lower electrode 10 and the upper electrode 20, the memory layer 30 is determined to be in the low resistance state, that is, the data of the memory cell MC is determined to be "1". Further, for example, when the current flowing between the lower electrode 10 and the upper electrode 20 does not exceed the predetermined threshold current, the memory layer 30 is determined to be in the high resistance state, that is, the data of the memory cell MC is determined to be "0".

Next, operations of the storage device, the method of controlling the storage device of the first embodiment and its effect will be described.

In the storage device and the method of controlling the storage device of the first embodiment, when the state of the memory layer 30 is changed from the high resistance state to the low resistance state, the first write voltage Vw1 having positive polarity, and the second write voltage Vw2 having negative polarity and having the absolute value larger than the absolute value of the first write voltage Vw1 are alternately applied to the upper electrode 20 a plurality of times and the final voltage is the second write voltage Vw2.

For example, a case is considered, in which only the second write voltage Vw2 having negative polarity is repeatedly applied to the upper electrode 20, without applying the first write voltage Vw1 having positive polarity. In this case, it is also possible to change the state of the memory layer 30 from the high resistance state to the low resistance state. However, in this case, when the write process is repeated, degradation of the characteristics of the memory layer 30 is caused due to voltage stress. Specifically, for example, electrical resistance of the memory layer 30 after the write process becomes unstable.

In the storage device and the method of controlling the storage device of the first embodiment, the first write voltage Vw1 having positive polarity, and the second write voltage Vw2 having negative polarity and having the absolute value larger than the absolute value of the first write voltage Vw1 are alternately applied to the upper electrode 20 a plurality of times and the final voltage is the second write voltage Vw2, and thereby, even when the write process is repeated, degradation of the characteristics of the memory layer 30 is suppressed. Specifically, for example, the electrical resistance of the memory layer 30 after the write process is stabilized. Accordingly, reliability of the storage device is improved.

In the storage device and the method of controlling the storage device of the first embodiment, when the state of the memory layer 30 is changed from the low resistance state to the high resistance state, the third write voltage Vw3 having negative polarity, and the fourth write voltage Vw4 having positive polarity and having the absolute value larger than the absolute value of the third write voltage Vw3 are alternately applied to the upper electrode 20 a plurality of times and the final voltage is the fourth write voltage Vw4.

For example, a case is considered, in which only the fourth write voltage Vw4 having positive polarity is repeatedly applied to the upper electrode 20, without applying the third write voltage Vw3 having negative polarity. In this case, it is also possible to change the state of the memory layer 30 from the low resistance state to the high resistance state. However, in this case, when the write process is repeated, degradation of the characteristics of the memory layer 30 is caused due to voltage stress. Specifically, for example, electrical resistance of the memory layer 30 after the write process becomes unstable.

In the storage device and the method of controlling the storage device of the first embodiment, the third write voltage Vw3 having negative polarity, and the fourth write voltage Vw4 having positive polarity and having the absolute value larger than the absolute value of the third write voltage Vw3 are alternately applied to the upper electrode 20 a plurality of times and the final voltage is the fourth write voltage Vw4, and thereby, even when the write process is repeated, degradation of the characteristics of the memory layer 30 is suppressed. Specifically, for example, the electrical resistance of the memory layer 30 after the write process is stabilized. Accordingly, reliability of the storage device is improved.

In the storage device and the method of controlling the storage device of the first embodiment, the read voltage Vr having negative polarity is applied to the upper electrode 20 at the time of the read process. The absolute value of the read voltage Vr is larger than the absolute value of the first threshold voltage Vt1, and smaller than the absolute value of the second threshold voltage Vt2.

Since the read voltage Vr is a negative voltage, data of the memory cell MC is not destroyed whether the data of the memory cell MC is data “0” or data “1”. Accordingly, it is possible to realize non-destructive readout of the memory cell MC.

Figure 6:
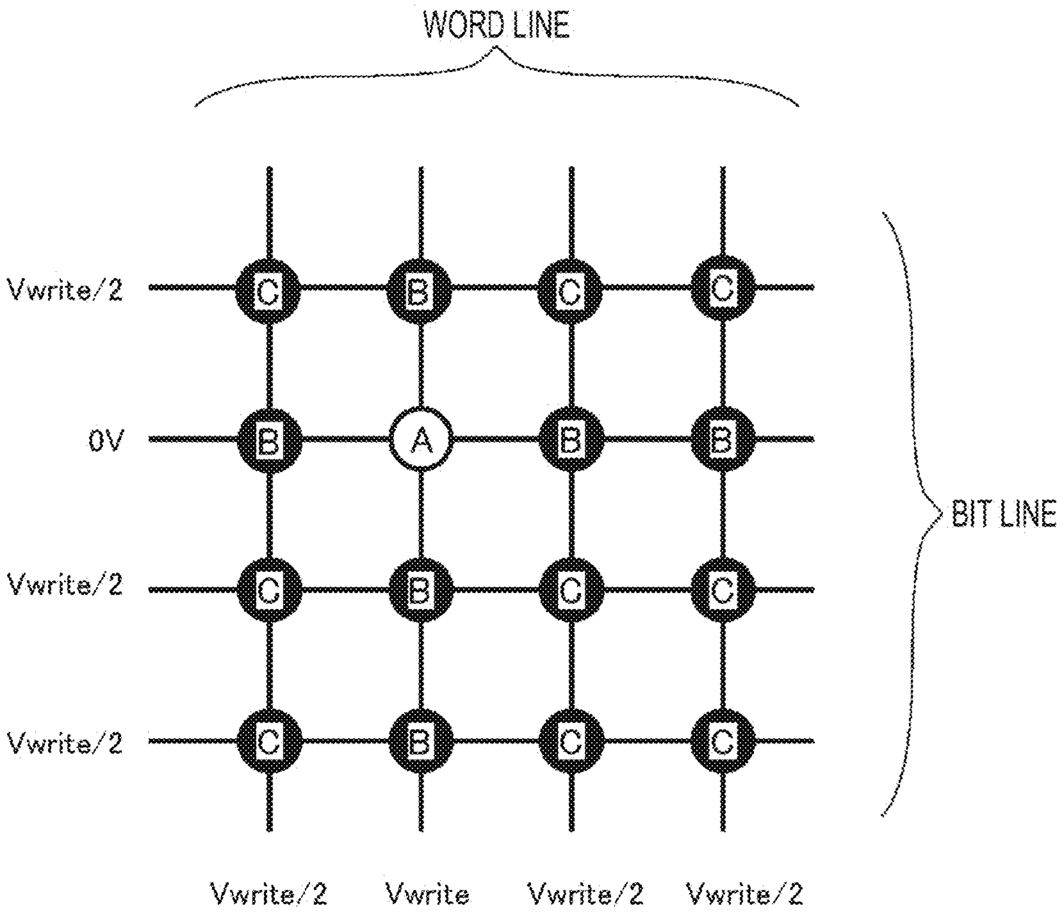
FIG. 6 is a diagram illustrating voltages applied to the wirings of the storage device of the first embodiment.

FIG. 6 is a diagram illustrating voltages applied to the wirings of the storage device of the first embodiment. FIG. 6 shows the voltages that are applied to the memory cells MC when one single memory cell MC in the memory cell array is selected for the write process. Intersections of the word lines and the bit lines express the respective memory cells MC.

The selected memory cell MC is a memory cell A (i.e., a selected cell). A write voltage Vwrite is applied to the word line connected to the memory cell A. Further, 0 V is applied to the bit line connected to the memory cell A.

Hereinafter, an example of the case in which a voltage (Vwrite/2) that is half the write voltage is applied to the word lines and the bit lines that are not connected to the memory cell A will be described.

A voltage that is applied to memory cells C (i.e., unselected cells) connected to the word lines and the bit lines that are not connected to the memory cell A is 0 V. That is, no voltage is applied.

On the other hand, the voltage (Vwrite/2) that is half the write voltage Vwrite is applied to memory cells B (i.e., half-selected cells) connected to the word line or the bit line that is connected to the memory cell A. Accordingly, a half-select leakage current flows through the memory cells B (i.e., half-selected cells).

Note that as an application method other than the above-described method, a method may be adopted, in which the voltage (Vwrite/2) that is half the write voltage is applied to the word line connected to the memory cell A, a negative voltage (−Vwrite/2) that is half the write voltage is applied to the bit line, and 0 V is applied to the word lines and the bit lines that are not connected to the memory cell A.

When the half-select leakage current is large, increase in power consumption of chips is caused, for example. Further, for example, voltage drop in wirings increases and a sufficiently high voltage is not applied to the selected cell, so that the write process to the memory cell MC becomes unstable. Accordingly, the current-voltage characteristic of the memory cell MC requires a low half-select leakage current.

As shown in FIG. 3 and FIG. 4, the memory cell MC of the storage device of the first embodiment has a nonlinear current-voltage characteristic in which a current sharply rises at the first threshold voltage Vt1 or the second threshold voltage Vt2 on the negative voltage side. In other words, the memory layer 30 of the storage device of the first embodiment has the nonlinear current-voltage characteristic in which the current sharply rises at the first threshold voltage Vt1 or the second threshold voltage Vt2 on the negative voltage side.

Furthermore, as shown in FIG. 3 and FIG. 4, the memory cell MC of the storage device of the first embodiment has a non-linear current-voltage characteristic in which a current sharply rises at the positive voltage side threshold voltage Vtp on the positive voltage side. In other words, in the memory layer 30 of the storage device of the first embodiment, a current sharply rises at the positive voltage side threshold voltage Vtp on the positive voltage side.

Since the memory cell MC of the storage device of the first embodiment has the non-linear current-voltage characteristics on the negative voltage side and the positive voltage side, it is possible to realize a low half-select leakage current.

As shown in FIG. 4, from the viewpoint of suppressing the half-select leakage current, the second write voltage Vw2 is set so that an absolute value of the voltage (Vw2/2) that is half the second write voltage Vw2 is smaller than the absolute value of the first threshold voltage Vt1. Further, as shown in FIG. 4, from the viewpoint of suppressing the half-select leakage current, the fourth write voltage Vw4 is set so that an absolute value of the voltage (Vw4/2) that is half the fourth write voltage Vw4 is smaller than the absolute value of the positive voltage side threshold voltage Vtp.

The memory layer 30 of the first embodiment can realize the variable resistance function for storing the data and the function of suppressing the half-select leakage current flowing through the half-selected cells, in a single layer.

As above, according to the first embodiment, it is possible to realize the storage device and the method of controlling the storage device that are improved in reliability.

Second Embodiment

A storage device of a second embodiment differs from the storage device of the first embodiment in that a memory cell can become a third state having electrical resistance higher than that of a first state and lower than that of a second state, and a fourth state having electrical resistance higher than that of the third state and lower than that of the second state, and in that in a write process, when a state of a memory layer is changed from the second state to the third state, a fifth voltage having positive polarity, and a sixth voltage having negative polarity and having an absolute value larger than an absolute value the fifth voltage are alternately applied to a second conductive layer a plurality of times and the final voltage is the fifth voltage, and in the write process, when the state of the memory layer is changed from the first state to the fourth state, a seventh voltage having negative polarity, and an eighth voltage having positive polarity and having an absolute value larger than an absolute value of the seventh voltage are alternately applied to the second conductive layer a plurality of times and the final voltage is the seventh voltage. Hereinafter, some of the descriptions that overlap with the first embodiment may not be repeated.

Figure 7:
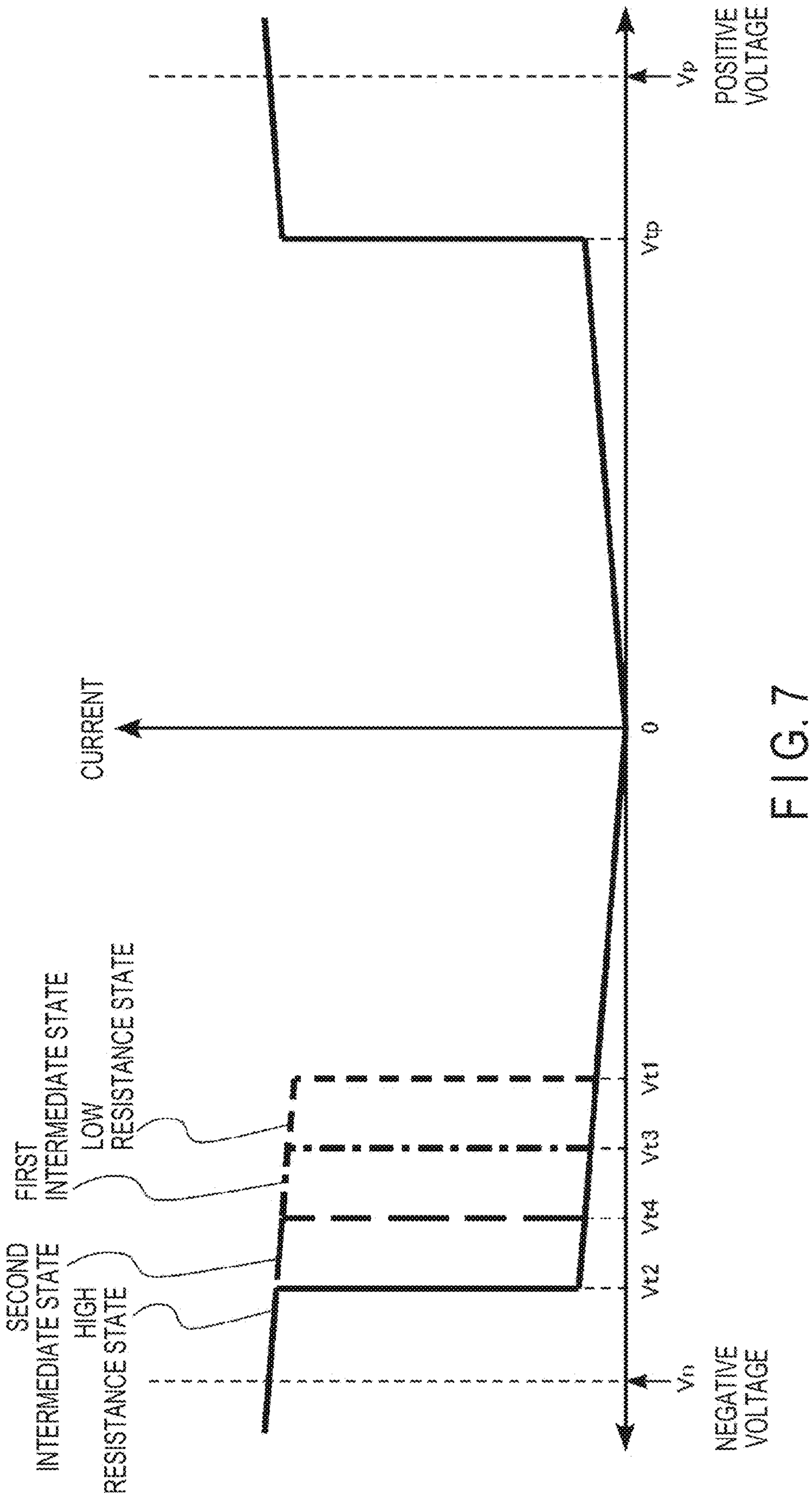
FIG. 7 is a diagram illustrating current-voltage characteristics of a storage device of a second embodiment.

FIG. 7 is a diagram illustrating current-voltage characteristics of the storage device of the second embodiment. The horizontal axis represents a voltage that is applied between electrodes, and the vertical axis represents a current flowing between the electrodes. In FIG. 7, the voltage that is applied to an upper electrode 20 based on a potential of a lower electrode 10 is shown in the horizontal axis. FIG. 7 is current-voltage characteristics of a memory layer 30 or a memory cell MC of the second embodiment.

As shown in FIG. 7, the memory cell MC of the second embodiment shows four different current-voltage characteristics according to the voltage conditions that are applied to the upper electrode 20.

In a first current-voltage characteristic, a current sharply rises at a first threshold voltage Vt1 on a negative voltage side. In this case, on a positive voltage side, a current sharply rises at a positive voltage side threshold voltage Vtp.

In a second current-voltage characteristic, a current sharply rises at a second threshold voltage Vt2 on the negative voltage side. An absolute value of the second threshold voltage Vt2 is larger than an absolute value of the first threshold voltage Vt1. In this case, a current sharply rises at the positive voltage side threshold voltage Vtp on a positive voltage side.

In a third current-voltage characteristic, a current sharply rises at a third threshold voltage Vt3 on the negative voltage side. An absolute value of the third threshold voltage Vt3 is larger than the absolute value of the first threshold voltage Vt1 and is smaller than the absolute value of the second threshold voltage Vt2. In this case, a current sharply rises at the positive voltage side threshold voltage Vtp on the positive voltage side.

In a fourth current-voltage characteristic, a current sharply rises at a fourth threshold voltage Vt4 on the negative voltage side. An absolute value of the fourth threshold voltage Vt4 is larger than the absolute value of the third threshold voltage Vt3 and is smaller than the absolute value of the second threshold voltage Vt2. In this case, a current sharply rises at the positive voltage side threshold voltage Vtp on the positive voltage side.

As in the case of the first embodiment, when a predetermined negative voltage Vn is applied to the upper electrode 20, a current sharply rises at the first threshold voltage Vt1 on the negative voltage side. When the predetermined negative voltage Vn is applied to the upper electrode 20, a current sharply rises at the positive voltage side threshold voltage Vtp on the positive voltage side. This characteristic is the first current-voltage characteristic.

On the other hand, as in the case of the first embodiment, when a predetermined positive voltage Vp is applied to the upper electrode 20, a current sharply rises at the second threshold voltage Vt2 on the negative voltage side. The absolute value of the second threshold voltage Vt2 is larger than the absolute value of the first threshold voltage Vt1. When the predetermined positive voltage Vp is applied to the upper electrode 20, a current sharply rises at the positive voltage side threshold voltage Vtp as in the case in which the predetermined negative voltage Vn is applied, on the positive voltage side. This characteristic is the second current-voltage characteristic.

An absolute value of the predetermined negative voltage Vn is larger than the absolute value of the second threshold voltage Vt2.

The memory cell MC of the second embodiment can become a low resistance state, a first intermediate state, a second intermediate state, and a high resistance state, on the negative voltage side. The memory layer 30 of the second embodiment can become the low resistance state, the first intermediate state, the second intermediate state, and the high resistance state on the negative voltage side.

In the first intermediate state, electrical resistance is higher than the low resistance state, and the electrical resistance is lower than the high resistance state. In the second intermediate state, electrical resistance is higher than the first intermediate state, and the electrical resistance is lower than the high resistance state.

Hereinafter, the low resistance state represents data "11", the first intermediate state represents data "10", the second intermediate state represents data "01", and the high resistance state represents data "00". That is, the memory cell MC of the second embodiment can represent four values of "11", "10", "01", and "00", and thereby can store 2-bit data. The memory cell MC of the second embodiment can be multi-valued.

Figure 8:
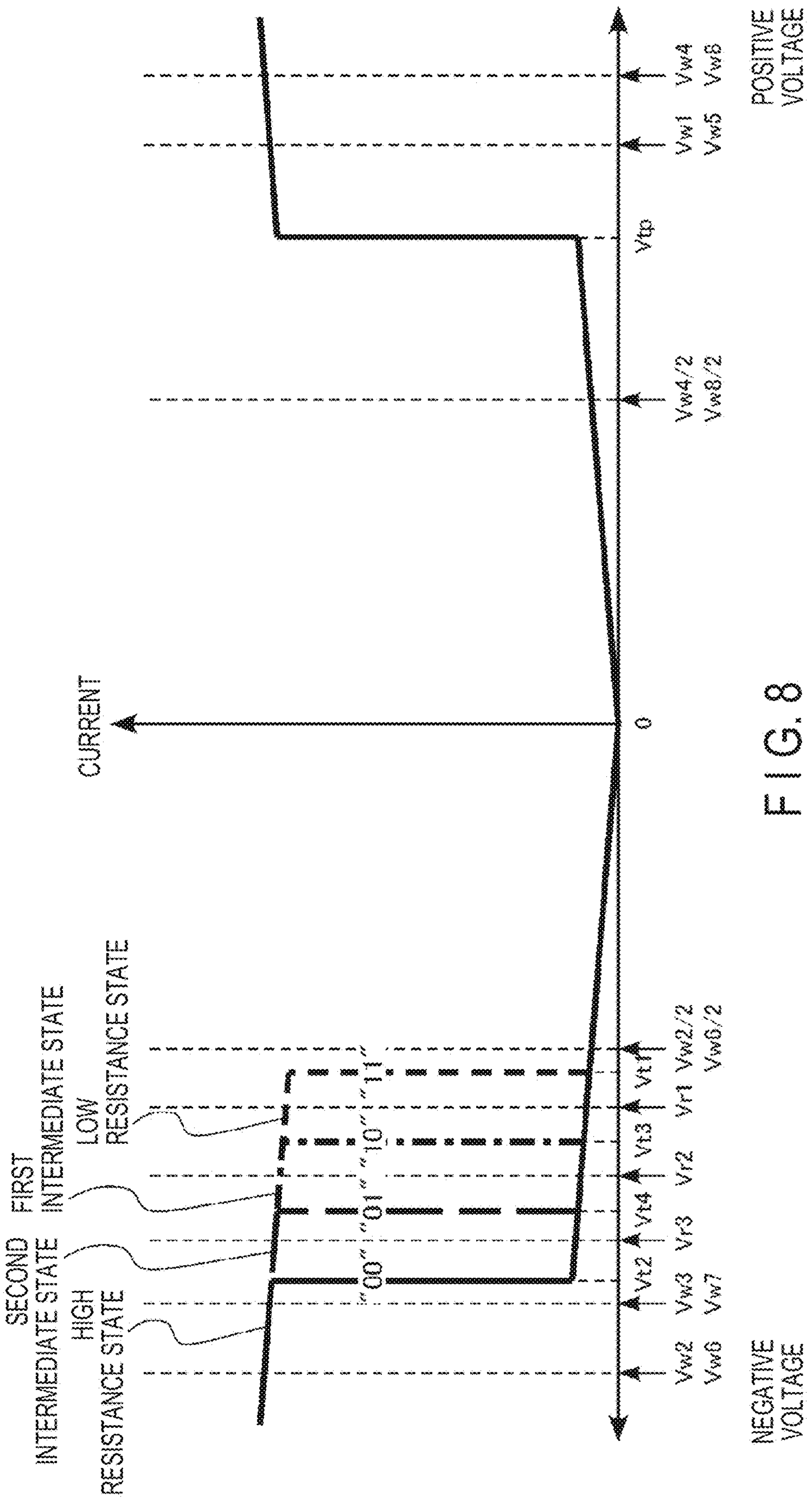
FIG. 8 is a diagram illustrating a memory operation of the storage device of the second embodiment.

FIG. 8 is a diagram illustrating a memory operation of the storage device of the second embodiment. FIG. 8 shows a first write voltage Vw1, a second write voltage Vw2, a third write voltage Vw3, a fourth write voltage Vw4, a fifth write voltage Vw5, a sixth write voltage Vw6, a seventh write voltage Vw7, an eighth write voltage Vw8, a voltage (Vw2/2) that is half the second write voltage Vw2, a voltage (Vw4/2) that is half the fourth write voltage Vw4, a voltage (Vw6/2) that is half the sixth write voltage Vw6, a voltage (Vw8/2) that is half the eighth write voltage Vw8, a first read voltage Vr1, a second read voltage Vr2, and a third read voltage Vr3, at a time of performing the memory operation.

FIG. 8 illustrates a case in which the first write voltage Vw1 and the fifth write voltage Vw5 are the same voltage, the second write voltage Vw2 and the sixth write voltage Vw6 are the same voltage, the third write voltage Vw3 and the seventh write voltage Vw7 are the same voltage, and the fourth write voltage Vw4 and the eighth write voltage Vw8 are the same voltage, but the respective voltages may be different voltages.

The first write voltage Vw1 is a positive voltage. The second write voltage Vw2 is a negative voltage. An absolute value of the second write voltage Vw2 is larger than an absolute value of the first write voltage Vw1. The absolute value of the second write voltage Vw2 is larger than or equal to 1.1 times and less than or equal to 5 times the absolute value of the first write voltage Vw1, for example.

The third write voltage Vw3 is a negative voltage. The fourth write voltage Vw4 is a positive voltage. An absolute value of the fourth write voltage Vw4 is larger than an absolute value of the third write voltage Vw3. The absolute value of the fourth write voltage Vw4 is larger than or equal to 1.1 times and less than or equal to 5 times the absolute value of the third write voltage Vw3, for example.

The fifth write voltage Vw5 is a positive voltage. The sixth write voltage Vw6 is a negative voltage. An absolute value of the sixth write voltage Vw6 is larger than an absolute value of the fifth write voltage Vw5. The absolute value of the sixth write voltage Vw6 is larger than or equal to 1.1 times and less than or equal to 5 times the absolute value of the fifth write voltage Vw5, for example.

The seventh write voltage Vw7 is a negative voltage. The eighth write voltage Vw8 is a positive voltage. An absolute value of the eighth write voltage Vw8 is larger than an absolute value of the seventh write voltage Vw7. The absolute value of the eighth write voltage Vw8 is larger than or equal to 1.1 times and less than or equal to 5 times the absolute value of the seventh write voltage Vw7, for example.

The first read voltage Vr1 is a negative voltage. An absolute value of the first read voltage Vr1 is larger than the absolute value of the first threshold voltage Vt1, and is smaller than the absolute value of the third threshold voltage Vt3. The absolute value of the first read voltage Vr1 is smaller than the absolute value of the second write voltage Vw2 and the absolute value of the sixth write voltage Vw6.

The second read voltage Vr2 is a negative voltage. An absolute value of the second read voltage Vr2 is larger than the absolute value of the third threshold voltage Vt3, and is smaller than the absolute value of the fourth threshold voltage Vt4. The absolute value of the second read voltage Vr2 is smaller than the absolute value of the second write voltage Vw2 and the absolute value of the sixth write voltage Vw6.

The third read voltage Vr3 is a negative voltage. An absolute value of the third read voltage Vr3 is larger than the absolute value of the fourth threshold voltage Vt4, and is smaller than the absolute value of the second threshold voltage Vt2. The absolute value of the third read voltage Vr3 is smaller than the absolute value of the second write voltage Vw2 and the absolute value of the sixth write voltage Vw6.

The absolute value of the third write voltage Vw3 is larger than the absolute value of the second threshold voltage Vt2. The absolute value of the second write voltage Vw2 is larger than the absolute value of the third write voltage Vw3, for example.

The absolute value of the seventh write voltage Vw7 is larger than the absolute value of the second threshold voltage Vt2. The absolute value of the sixth write voltage Vw6 is larger than the absolute value of the seventh write voltage Vw7, for example.

First, a write process to the memory cell MC of the second embodiment will be described. The write process is performed by using a first control circuit 104 and a second control circuit 105.

Figure 9:
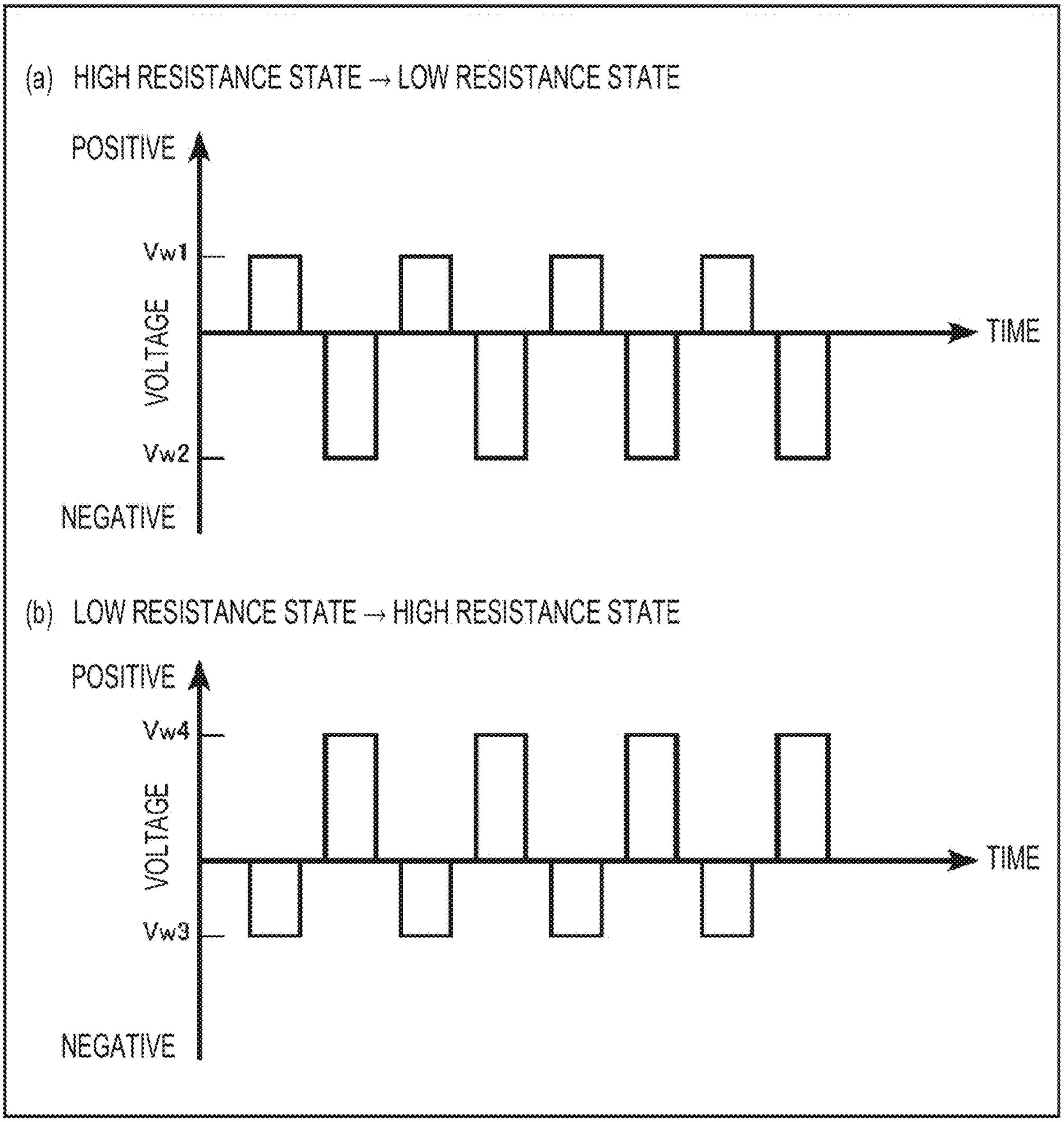
FIG. 9 and FIG. 10 are diagrams illustrating write processes of the storage device of the second embodiment.

FIG. 9 is a diagram illustrating the write process of the storage device of the second embodiment. Specifically, FIG. 9(*a*) and FIG. 9(*b*) show change over time of a voltage that is applied between the lower electrode 10 and the upper electrode 20 of the memory cell MC at a time of the write process. The vertical axis shows a voltage that is applied to the upper electrode 20 based on a potential of the lower electrode 10.

The voltage that is applied to between the lower electrode 10 and the upper electrode 20 of the memory cell MC is applied as a rectangular wave or a triangular wave, for example.

FIG. 9(*a*) shows a case in which a state of the memory layer 30 is changed from the high resistance state to the low resistance state. In other words, FIG. 9(*a*) shows a case in which data of the memory cell MC is changed from data “00” to data “11”. In other words, FIG. 9(*a*) shows a case in which data “11” is written to the memory cell MC.

When the state of the memory layer 30 is changed from the high resistance state to the low resistance state, the first write voltage Vw1 having positive polarity, and the second write voltage Vw2 having negative polarity and having the absolute value larger than the absolute value of the first write voltage Vw1 are alternately applied to the upper electrode 20 a plurality of times and the final voltage is the second write voltage Vw2.

Although FIG. 9(*a*) illustrates the case in which the first write voltage Vw1 and the second write voltage Vw2 are alternately applied four times, the number of repetitions of application is not particularly limited as long as it is once or more. Further, although FIG. 9(*a*) illustrates the case in which a voltage that is applied first is the first write voltage Vw1, the voltage that is applied first may be the second write voltage Vw2.

FIG. 9(*b*) shows a case in which the state of the memory layer 30 is changed from the low resistance state to the high resistance state. That is, FIG. 9(*b*) shows the case in which data of the memory cell MC is changed from data “11” to data “00”. In other words, FIG. 9(*b*) shows the case in which data “00” is written to the memory cell MC.

When the state of the memory layer 30 is changed from the low resistance state to the high resistance state, the third write voltage Vw3 having negative polarity, and the fourth write voltage Vw4 having positive polarity and having the absolute value larger than the absolute value of the third write voltage Vw3 are alternately applied to the upper electrode 20 a plurality of times and the final voltage is the fourth write voltage Vw4.

Although FIG. 9(*b*) illustrates the case in which the third write voltage Vw3 and the fourth write voltage Vw4 are alternately applied four times, the number of repetitions of application is not particularly limited as long as it is once or more. Further, although FIG. 9(*b*) illustrates the case in which the voltage that is applied first is the third write voltage Vw3, the voltage that is applied first may be the fourth write voltage Vw4.

Figure 10:
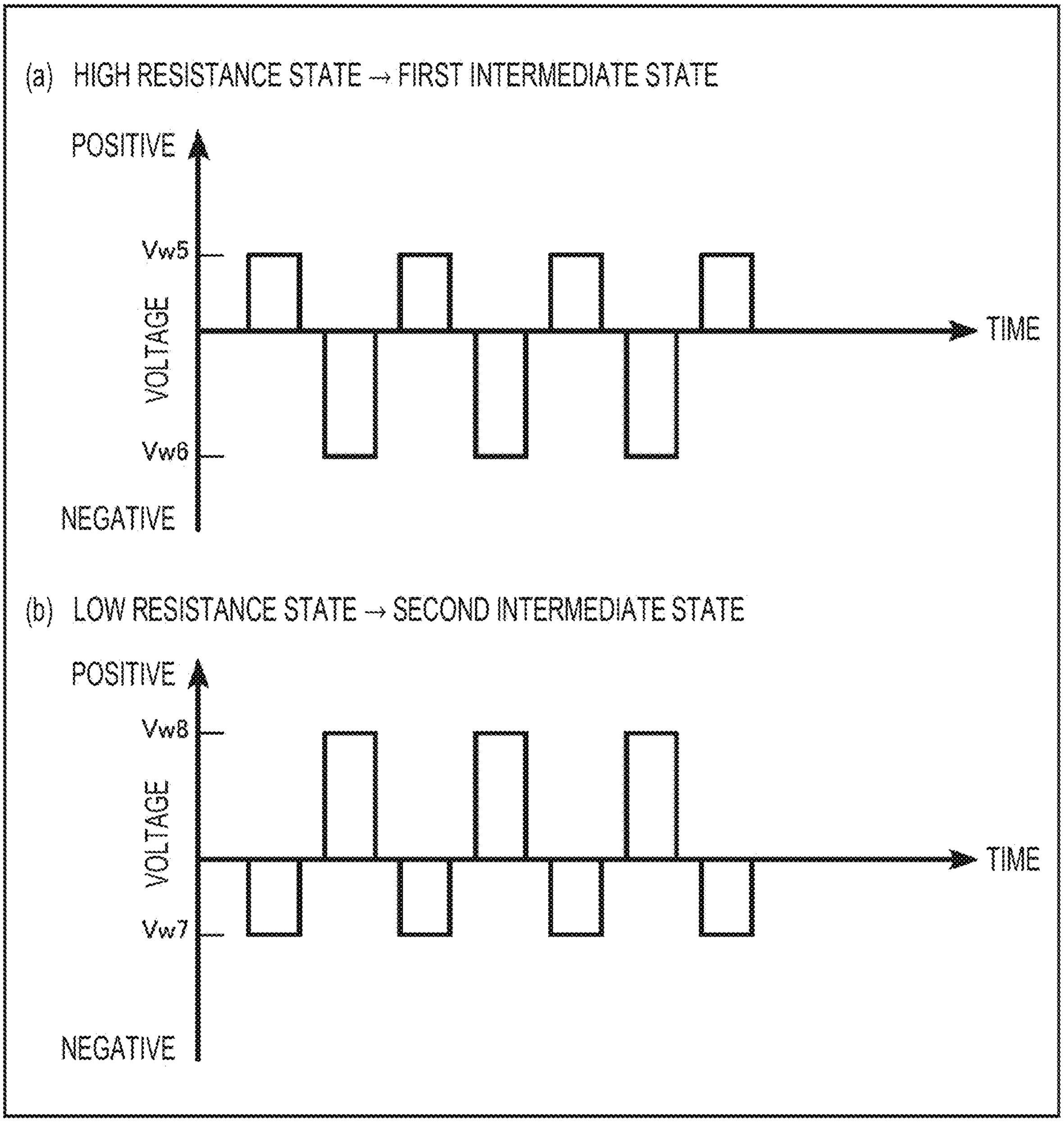

FIG. 10 is a diagram illustrating the write process of the storage device of the second embodiment. Specifically, FIG. 10(*a*) and FIG. 10(*b*) show change over time of the voltages that are applied between the lower electrode 10 and the upper electrode 20 of the memory cell MC at the time of the write process. The vertical axis shows a voltage that is applied to the upper electrode 20 based on a potential of the lower electrode 10.

The voltage that is applied between the lower electrode 10 and the upper electrode 20 of the memory cell MC is applied as a rectangular wave or a triangular wave, for example.

FIG. 10(*a*) shows a case in which the state of the memory layer 30 is changed from the high resistance state to the first intermediate state. That is, FIG. 10(*a*) shows the case in which the data of the memory cell MC is changed from data “00” to data “10”. In other words, FIG. 10(*a*) shows the case in which data “10” is written to the memory cell MC.

When the state of the memory layer 30 is changed from the high resistance state to the first intermediate state, the fifth write voltage Vw5 having positive polarity, and the sixth write voltage Vw6 having negative polarity and having the absolute value larger than the absolute value of the fifth write voltage Vw5 are alternately applied to the upper electrode 20 a plurality of times and the final voltage is the fifth write voltage Vw5.

Although FIG. 10(*a*) illustrates the case in which the fifth write voltage Vw5 is applied four times and the sixth write voltage Vw6 is applied three times, the number of repetitions of application is not particularly limited as long as it is once or more. Further, although FIG. 10(*a*) illustrates the case in which a voltage that is applied first is the fifth write voltage Vw5, the voltage which is applied first may be the sixth write voltage Vw6.

FIG. 10(*b*) shows a case in which the state of the memory layer 30 is changed from the low resistance state to the second intermediate state. That is, FIG. 10(*b*) shows the case in which data of the memory cell MC is changed from data “11” to data “01”. In other words, FIG. 10(*b*) shows the case in which data “01” is written to the memory cell MC.

When the state of the memory layer 30 is changed from the low resistance state to the second intermediate state, the seventh write voltage Vw7 having negative polarity, and the eighth write voltage Vw8 having positive polarity and having the absolute value larger than the absolute value of the seventh write voltage Vw7 are alternately applied to the upper electrode 20 a plurality of times and the final voltage is the seventh write voltage Vw7.

Although FIG. 10(*b*) illustrates the case in which the seventh write voltage Vw7 is applied four times and the eighth write voltage Vw8 is applied three times, the number of repetitions of application is not particularly limited as long as it is once or more. Further, although FIG. 10(*b*) illustrates the case in which the voltage that is applied first is the seventh write voltage Vw7, the voltage applied first may be the eighth write voltage Vw8.

Next, a read process to the memory cell MC will be described. The read process is performed by using the first control circuit 104, the second control circuit 105, and a sense circuit 106.

In the read process, the first read voltage Vr1, the second read voltage Vr2, or the third read voltage Vr3 are applied to the upper electrode 20. The first read voltage Vr1, the second read voltage Vr2, and the third read voltage Vr3 are negative voltages.

The first read voltage Vr1, the second read voltage Vr2, or the third read voltage Vr3 is applied to the upper electrode 20, and for example, a current flowing between the lower electrode 10 and the upper electrode 20 is detected by the sense circuit 106. Further, the first read voltage Vr1, the second read voltage Vr2, or the third read voltage Vr3 is applied to the upper electrode 20, and for example, a change in a potential of the upper electrode 20 or the lower electrode 10 is detected by the sense circuit 106. The change in the potential of the upper electrode 20 or the lower electrode 10 is detected as a change in a potential of the bit line 103, for example.

For example, when the current exceeds a predetermined threshold current when the first read voltage Vr1 is applied, the memory layer 30 is determined to be in the low resistance state, that is, the data of the memory cell MC is determined to be "11".

For example, when the current does not exceed the predetermined threshold current when the first read voltage Vr1 is applied, and the current exceeds the predetermined threshold current when the second read voltage Vr2 is applied, the memory layer 30 is determined to be in the first intermediate state, that is, the data of the memory cell MC is determined to be "10".

For example, when the current does not exceed the predetermined threshold current when the second read voltage Vr2 is applied, and the current exceeds the predetermined threshold current when the third read voltage Vr3 is applied, it is determined that the memory layer 30 is in the second intermediate state, that is, the data of the memory cell MC is "01".

For example, when the current does not exceed the predetermined threshold current when the third read voltage Vr3 is applied, it is determined that the memory layer 30 is in the high resistance state, that is, the data of the memory cell MC is "00".

Next, operations of the storage device, the method of controlling the storage device of the second embodiment and its effect will be described.

In the storage device and the method of controlling the storage device of the second embodiment, the multi-valued memory cell MC can be realized. Accordingly, for example, increase in the capacity of the storage device can be easily realized.

In the storage device and the method of controlling the storage device of the second embodiment, as in the first embodiment, when the state of the memory layer 30 is changed from the high resistance state to the low resistance state, the first write voltage Vw1 having positive polarity, and the second write voltage Vw2 having negative polarity and having the absolute value larger than the absolute value of the first write voltage Vw1 are alternately applied to the upper electrode 20 a plurality of times and the final voltage is the second write voltage Vw2. Accordingly, as in the first embodiment, reliability of the storage device is improved.

In the storage device and the method of controlling the storage device of the second embodiment, as in the first embodiment, when the state of the memory layer 30 is changed from the low resistance state to the high resistance state, the third write voltage Vw3 having negative polarity, and the fourth write voltage Vw4 having positive polarity and having the absolute value larger than the absolute value of the third write voltage Vw3 are alternately applied to the upper electrode 20 a plurality of times and the final voltage is the fourth write voltage Vw4. Accordingly, as in the first embodiment, reliability of the storage device is improved.

In the storage device and the method of controlling the storage device of the second embodiment, when the state of the memory layer 30 is changed from the high resistance state to the first intermediate state, the fifth write voltage Vw5 having positive polarity, and the sixth write voltage Vw6 having negative polarity and having the absolute value larger than the absolute value of the fifth write voltage Vw5 are alternately applied to the upper electrode 20 a plurality of times and the final voltage is the fifth write voltage Vw5.

For example, a case is considered, in which to the upper electrode 20, only the sixth write voltage Vw6 having negative polarity is repeatedly applied, and the fifth write voltage Vw5 is applied only once at the end. In this case, it is also possible to change the state of the memory layer 30 from the high resistance state to the first intermediate state. However, in this case, when the write process is repeated, degradation of the characteristics of the memory layer 30 is caused due to voltage stress. Specifically, for example, the electrical resistance of the memory layer 30 after the write process becomes unstable.

In the storage device and the method of controlling the storage device of the second embodiment, the fifth write voltage Vw5 having positive polarity, and the sixth write voltage Vw6 having negative polarity and having the absolute value larger than the absolute value of the fifth write voltage Vw5 are alternately applied to the upper electrode 20 a plurality of times and the final voltage is the fifth write voltage Vw5, and thereby even when the write process is repeated, degradation of the characteristics of the memory layer 30 is suppressed. Specifically, for example, the electrical resistance of the memory layer 30 after the write process is stabilized. Accordingly, reliability of the storage device is improved.

In the storage device and the method of controlling the storage device of the second embodiment, when the state of the memory layer 30 is changed from the low resistance state to the second intermediate state, the seventh write voltage Vw7 having negative polarity, and the eighth write voltage Vw8 having positive polarity and having the absolute value larger than the absolute value of the seventh write voltage Vw7 are alternately applied to the upper electrode 20 a plurality of times and the final voltage is the seventh write voltage Vw7.

For example, a case is considered, in which to the upper electrode 20, only the eighth write voltage Vw8 having positive polarity is repeatedly applied, and the seventh write voltage Vw7 is applied only once at the end. In this case, it is also possible to change the state of the memory layer 30 from the low resistance state to the second intermediate state. However, in this case, when the write process is repeated, degradation of the characteristics of the memory layer 30 is caused due to voltage stress. Specifically, for example, the electrical resistance of the memory layer 30 after the write process becomes unstable.

In the storage device and the method of controlling the storage device of the second embodiment, the seventh write voltage Vw7 having negative polarity, and the eighth write voltage Vw8 having positive polarity and having the absolute value larger than the absolute value of the seventh write voltage Vw7 are alternately applied to the upper electrode 20 a plurality of times and the final voltage is the seventh write voltage Vw7, and thereby even when the write process is repeated, degradation of the characteristics of the memory layer 30 is suppressed. Specifically, for example, the electrical resistance of the memory layer 30 after the write process is stabilized. Accordingly, reliability of the storage device is improved.

The memory cell MC of the storage device of the second embodiment has nonlinear current-voltage characteristics on the negative voltage side and the positive voltage side similarly to the memory cell MC of the storage device of the first embodiment, and thereby can realize a low half-select leakage current.

As shown in FIG. 8, from a viewpoint of suppressing the half-select leakage current, the second write voltage Vw2 and the sixth write voltage Vw6 are set so that an absolute value of the voltage (Vw2/2) that is half the second write voltage Vw2, and an absolute value of the voltage (Vw6/2) that is half the sixth write voltage Vw6 are smaller than the absolute value of the first threshold voltage Vt1. Further, as shown in FIG. 8, from the viewpoint of suppressing the half-select leakage current, the fourth write voltage Vw4 and the eighth write voltage Vw8 are set so that an absolute value of the voltage (Vw4/2) that is half the fourth write voltage Vw4, and an absolute value of the voltage (Vw8/2) that is half the eighth write voltage Vw8 are smaller than the absolute value of the positive voltage side threshold voltage Vtp.

The memory layer 30 of the second embodiment realizes the variable resistance function for storing data and the function of suppressing the half-select leakage current flowing through the half-selected cells in the single layer.

As above, according to the second embodiment, the storage device and the method of controlling the storage device in which reliability is improved can be realized. Further, according to the second embodiment, it is possible to realize the storage device and the method of controlling the storage device capable of realizing multi-value.

In the first and second embodiments, as the two-terminal storage device, the structure in which the word lines 102 and the bit lines 103 extend in the direction parallel to the surface of the semiconductor substrate 101 is described as an example, but embodiments of the present disclosure are not limited to the above-described structure. For example, a structure in which the word lines 102 or the bit lines 103 extend in the direction perpendicular to the surface of the semiconductor substrate 101 may be adopted.

In the first and second embodiments, the case in which the memory cell MC and the memory layer 30 are in the single resistance state on the positive voltage side is described as an example, but the configuration in which the memory cell MC and the memory layer 30 can also become a plurality of resistance states on the positive voltage side as on the negative voltage side may be adopted.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A storage device comprising:

a memory cell including a first conductive layer, a second conductive layer, and a memory layer that is between the first and second conductive layers and can switch between a plurality of states, the states including a first state and a second state in which electrical resistance of the memory layer is higher than in the first state; and a control circuit configured to execute a write process by which the states of the memory cell are switched, the write process including a first write process and a second write process, wherein the control circuit is configured to:

in the first write process to switch the memory layer from the second state to the first state, alternately apply to the second conductive layer a first pulse having a first voltage of positive polarity and a second pulse having a second voltage of negative polarity a plurality of times, an absolute value of the second voltage being larger than an absolute value of the first voltage, and a final pulse applied to the second conductive layer in the first write process being the second pulse, and in the second write process to switch the memory layer from the first state to the second state, alternately apply to the second conductive layer a third pulse having a third voltage of negative polarity and a fourth pulse having a fourth voltage of positive polarity a plurality of times, an absolute value of the fourth voltage being larger than an absolute value of the third voltage, and a final pulse applied to the second conductive layer in the second write process being the fourth pulse.

2. The storage device according to claim 1, wherein the absolute value of the second voltage is larger than or equal to 1.1 times and less than or equal to 5 times the absolute value of the first voltage, and the absolute value of the fourth voltage is larger than or equal to 1.1 times and less than or equal to 5 times the absolute value of the third voltage.

3. The storage device according to claim 1, wherein an absolute value of a current flowing through the memory layer by application of the second voltage is larger than or equal to 1.1 times and less than or equal to 5 times an absolute value of a current flowing through the memory layer by application of the first voltage, and an absolute value of a current flowing through the memory layer by application of the fourth voltage is larger than or equal to 1.1 times and less than or equal to 5 times an absolute value of a current flowing through the memory layer by application of the third voltage.

4. The storage device according to claim 1, further comprising:

a sense circuit configured to detect either a current flowing between the first and second conductive layers or a potential of one of the first and second conductive layers, wherein the control circuit is configured to execute a read process on the memory cell, the control circuit is configured to, in the read process, apply a predetermined voltage between the first and second conductive layers so that the potential of the second conductive layer is lower than the potential of the first conductive layer, and the sense circuit is configured to detect the current or the potential when the predetermined voltage is applied.

5. The storage device according to claim 4, wherein an absolute value of the predetermined voltage is less than the absolute value of the second voltage.

6. The storage device according to claim 1, wherein the states further include:

a third state in which the electrical resistance of the memory layer is higher than in the first state and lower than in the second state, and a fourth state in which the electrical resistance of the memory layer is higher than in the third state and lower than in the second state.

7. The storage device according to claim 6, wherein the write process further includes a third write process and a fourth write process, and the control circuit is configured to:

in the third write process to switch the memory layer from the second state to the third state, alternately apply to the second conductive layer a fifth pulse having a fifth voltage of positive polarity and a sixth pulse having a sixth voltage of negative polarity a plurality of times, an absolute value of the sixth voltage being larger than an absolute value of the fifth voltage, and a final pulse applied to the second conductive layer in the third write process being the fifth pulse, and in the fourth write process to switch the memory layer from the first state to the fourth state, alternately apply to the second conductive layer a seventh pulse having a seventh voltage of negative polarity and an eighth pulse having an eighth voltage of positive polarity a plurality of times, an absolute value of the eighth voltage being larger than an absolute value of the seventh voltage, and a final pulse applied to the second conductive layer in the fourth write process being the seventh pulse.

8. The storage device according to claim 1, wherein the memory layer is in contact with the first and second conductive layers.

9. The storage device according to claim 1, wherein the memory layer is a single layer.

10. The storage device according to claim 1, wherein the memory layer includes:

an oxide or oxynitride of a first element that is at least one element selected from the group consisting of zirconium, aluminum, yttrium, tantalum, lanthanum, cerium, titanium, hafnium, magnesium, scandium, vanadium, and niobium, and a compound of a second element and a third element, the second element being at least one element selected from the group consisting of zinc, tin, gallium, indium, and bismuth, and the third element being at least one element selected from the group consisting of tellurium, sulfur, and selenium.

11. The storage device according to claim 1, wherein the memory layer includes a zirconium oxide and a zinc telluride.

12. The storage device according to claim 1, wherein the memory layer includes:

an oxide or oxynitride of a first element that is at least one element selected from the group consisting of zirconium, aluminum, yttrium, tantalum, lanthanum, cerium, titanium, hafnium, magnesium, scandium, vanadium, and niobium, antimony, and a second element that is at least one element selected from the group consisting of carbon, boron, nitrogen, silicon, and tin.

13. The storage device according to claim 1, wherein the first conductive layer includes tungsten, and the second conductive layer includes carbon.

14. The storage device according to claim 1, wherein the memory layer has a nonlinear current-voltage characteristic in which a current rises at a specific threshold voltage, and the threshold voltage changes by application of a predetermined voltage.

15. The storage device according to claim 1, further comprising:

a plurality of first wirings; and a plurality of second wirings that intersect the plurality of first wirings, wherein the memory cell is provided in a region where one of the plurality of first wirings and one of the plurality of second wirings intersect each other.

16. A method of controlling a storage device including a memory cell including a first conductive layer, a second conductive layer, and a memory layer that is between the first and second conductive layers and can switch between a plurality of states, the states including a first state and a second state in which electrical resistance of the memory layer is higher than in the first state, the method comprising:

performing a write process by which the states of the memory cell are switched, the write process including a first write process and a second write process, the first write process for switching the memory layer from the second state to the first state including alternately applying to the second conductive layer a first pulse having a first voltage of positive polarity and a second pulse having a second voltage of having negative polarity a plurality of times, an absolute value of the second voltage being larger than an absolute value of the first voltage, and a final pulse applied to the second conductive layer in the first write process being the second pulse, and the second write process for switching the memory layer from the first state to the second state including alternately applying to the second conductive layer a third pulse having a third voltage of negative polarity and a fourth pulse having a fourth voltage of positive polarity a plurality of times, an absolute value of the fourth voltage being larger than an absolute value of the third voltage, and a final pulse applied to the second conductive layer in the second write process being the fourth pulse.

17. The method according to claim 16, further comprising:

performing a read process on the memory cell, the read process including:

applying a predetermined voltage between the first and second conductive layers so that a potential of the second conductive layer is lower than a potential of the first conductive layer, and detecting either a current flowing between the first and second conductive layers or the potential of one of the first and second conductive layers when the predetermined voltage is applied.

18. A storage device comprising:

a memory cell comprising a first conductive layer, a second conductive layer, and a memory layer that is between the first and second conductive layers and can switch between a plurality of states, the states including:

a first state, a second state in which electrical resistance of the memory layer is higher than in the first state, a third state in which the electrical resistance of the memory layer is higher than in the first state and lower than in the second state, and a fourth state in which the electrical resistance of the memory layer is higher than in the third state and lower than in the second state; and a control circuit configured to execute a write process by which the states of the memory cell are switched, the write process including a first write process, a second write process, a third write process, and a fourth write process, wherein the control circuit is configured to:

in the first write process to switch the memory layer from the second state to the first state, alternately apply to the second conductive layer a first pulse having a first voltage of positive polarity and a second pulse having a second voltage of negative polarity, an absolute value of the second voltage being larger than an absolute value of the first voltage, in the second write process to switch the memory layer from the first state to the second state, alternately apply to the second conductive layer a third pulse having a third voltage of negative polarity and a fourth pulse having a fourth voltage of positive polarity, an absolute value of the fourth voltage being larger than an absolute value of the third voltage, in the third write process to switch the memory layer from the second state to the third state, alternately apply to the second conductive layer a fifth pulse having a fifth voltage of positive polarity and a sixth pulse having a sixth voltage of negative polarity, an absolute value of the sixth voltage being larger than an absolute value of the fifth voltage, and in the fourth write process to switch the memory layer from the first state to the fourth state, alternately apply to the second conductive layer a seventh pulse having a seventh voltage of negative polarity and an eighth pulse having an eighth voltage of positive polarity, an absolute value of the eighth voltage being larger than an absolute value of the seventh voltage.

* * * * *